(12) United States Patent
Chen et al.

(10) Patent No.: US 10,535,840 B2
(45) Date of Patent: Jan. 14, 2020

(54) ORGANIC LIGHT-EMITTING DIODE DISPLAYS

(71) Applicant: Apple Inc., Cupertino, CA (US)

(72) Inventors: Chieh-Wei Chen, Campbell, CA (US); Ting-Yi Cho, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/167,391

(22) Filed: Oct. 22, 2018

(65) Prior Publication Data

US 2019/0237701 A1 Aug. 1, 2019

Related U.S. Application Data

(60) Provisional application No. 62/622,657, filed on Jan. 26, 2018.

(51) Int. Cl.

| | |
|---|---|
| *H01L 51/52* | (2006.01) |
| *H01L 27/32* | (2006.01) |
| *H01L 27/12* | (2006.01) |
| *H01L 29/417* | (2006.01) |
| *H01L 29/786* | (2006.01) |

(52) U.S. Cl.
CPC ........ *H01L 51/5256* (2013.01); *H01L 27/124* (2013.01); *H01L 27/3246* (2013.01); *H01L 29/41733* (2013.01); *H01L 29/78633* (2013.01); *H01L 51/5206* (2013.01); *H01L 51/5221* (2013.01); *H01L 27/323* (2013.01)

(58) Field of Classification Search
CPC ............. H01L 51/5256; H01L 51/5221; H01L 27/124; H01L 27/3246; H01L 51/5206; H01L 27/323
See application file for complete search history.

(56) References Cited

U.S. PATENT DOCUMENTS

| | | |
|---|---|---|
| 6,861,800 B2 | 3/2005 | Tyan et al. |
| 7,400,439 B2 | 7/2008 | Holman |
| 7,589,461 B2 * | 9/2009 | Park .................... H01L 51/5275 313/110 |

(Continued)

FOREIGN PATENT DOCUMENTS

WO 2018171166 A1 9/2018

*Primary Examiner* — Karen Kusumakar
(74) *Attorney, Agent, or Firm* — Treyz Law Group, P.C.; G. Victor Treyz; Tianyi He

(57) ABSTRACT

A display may have an array of pixels. Each pixel may have a light-emitting diode such as an organic light-emitting diode. The organic light-emitting diodes may each have a reflective electrode such as a metal anode and a partially reflective electrode such as a metal cathode. Emissive material may be formed between the electrodes. The electrodes of each organic light-emitting diode may form an optical cavity. A wrinkled layer may be formed over the optical cavity to reduce sensitivity to process variations associated with forming encapsulation structures for the display. The wrinkled layer may include annealed organic layers. The organic layers may wrinkle during an annealing process at an annealing temperature. The annealed organic layers may include a first organic layer with a glass transition temperature below the annealing temperature and a second organic layer with a glass transition temperature above the annealing temperature.

17 Claims, 4 Drawing Sheets

(56) References Cited

U.S. PATENT DOCUMENTS

| | | | |
|---|---|---|---|
| 8,344,360 B2 | 1/2013 | Auch et al. | |
| 8,519,385 B2 | 8/2013 | Lim et al. | |
| 8,987,987 B2 * | 3/2015 | Boerner | H01L 51/5231 313/504 |
| 9,612,390 B2 | 4/2017 | Thompson et al. | |
| 9,954,195 B2 | 4/2018 | Lee | |
| 10,177,126 B2 | 1/2019 | Hack et al. | |
| 2009/0015142 A1 * | 1/2009 | Potts | B82Y 20/00 313/504 |
| 2011/0198620 A1 * | 8/2011 | Han | H05B 33/04 257/88 |
| 2012/0256201 A1 * | 10/2012 | Lee | H01L 51/5256 257/88 |
| 2017/0025641 A1 | 1/2017 | Zhang et al. | |
| 2017/0098798 A1 * | 4/2017 | Park | H01L 51/5253 |

\* cited by examiner

ORGANIC LIGHT-EMITTING DIODE DISPLAYS

This application claims the benefit of provisional patent application No. 62/622,657, filed Jan. 26, 2018, which is hereby incorporated by reference herein in its entirety.

FIELD

This relates generally to electronic devices, and, more particularly, to electronic devices with displays.

BACKGROUND

Electronic devices often include displays. Displays such as organic light-emitting diode displays have pixels with light-emitting diodes. The light emitting diodes each have electrodes (i.e., an anode and a cathode). Emissive material is interposed between the electrodes. During operation, current passes through the emissive material between the electrodes, generating light.

The pixels in organic light-emitting diode displays may include optical cavities. The presence of an optical cavity may enhance color performance and efficiency, but may make the performance of each pixel sensitive to process variations. For example, variations in encapsulation layer thickness may result in undesired color variations.

SUMMARY

A display may have an array of pixels. Each pixel may have a light-emitting diode such as an organic light-emitting diode. The organic light-emitting diodes may each have a reflective electrode such as a metal anode and a partially reflective electrode such as a metal cathode. Emissive material may be formed between the electrodes. The electrodes of each organic light-emitting diode may form an optical cavity.

A wrinkled layer may be formed on the partially reflective electrode to reduce sensitivity to process variations associated with forming encapsulation structures for the display. The wrinkled layer may include annealed organic layers. The organic layers may wrinkle during an annealing process at an annealing temperature. The annealed organic layers may include a first organic layer with a glass transition temperature below the annealing temperature and a second organic layer with a glass transition temperature above the annealing temperature.

DETAILED DESCRIPTION

Figure 1:
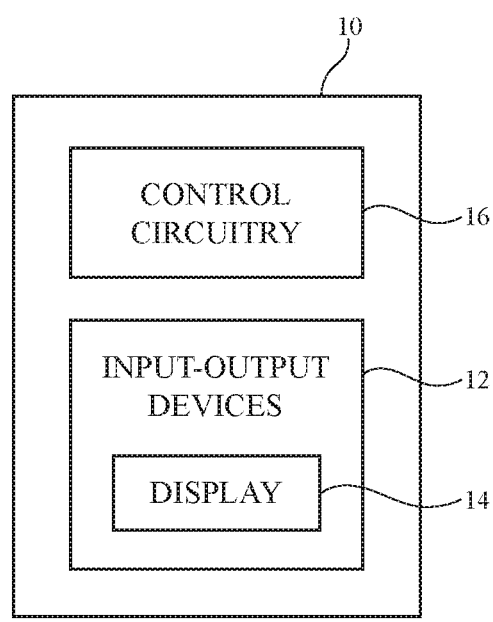
FIG. 1 is a schematic diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, and other electrical components. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display or may be a display based on other types of display technology. Configurations in which display 14 is an organic light-emitting diode display are sometimes described herein as an example. If desired, organic light-emitting diodes may be used in non-display organic light-emitting diode devices (e.g., lighting devices).

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
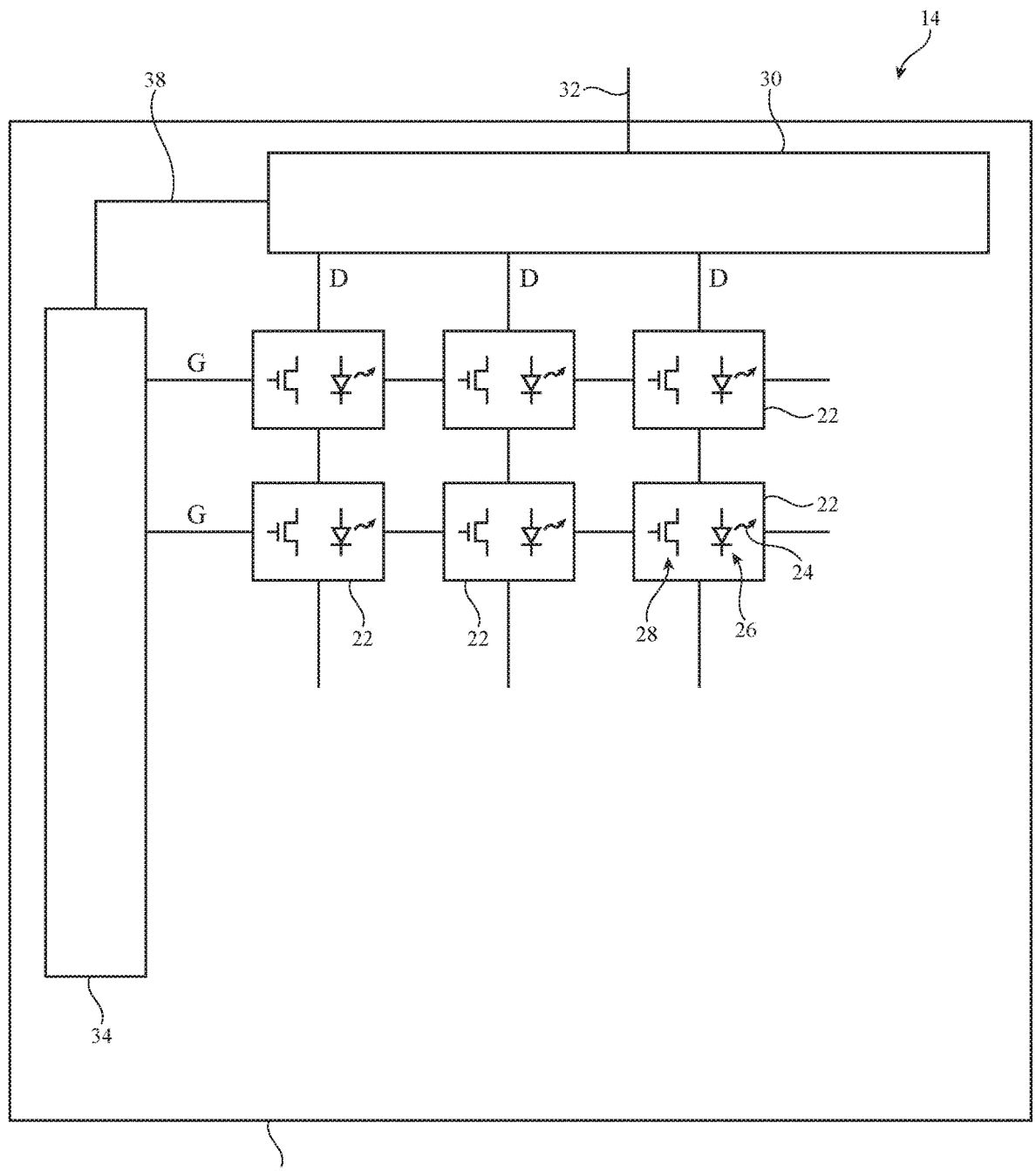
FIG. 2 is a top view of an illustrative display in an electronic device in accordance with an embodiment.

A top view of a portion of display 14 is shown in FIG. 2. As shown in FIG. 2, display 14 may have an array of pixels 22 formed on substrate 36. Substrate 36 may be formed from glass, metal, plastic, ceramic, or other substrate materials. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel circuit formed from thin-film transistor circuitry such as thin-film transistors 28 and thin-film capacitors). Thin-film transistors 28 may be polysilicon thin-film transistors, semiconducting-oxide thin-film transistors such as indium gallium zinc oxide transistors, or thin-film transistors formed from other semiconductors. Pixels 22 may contain light-emitting diodes of different colors (e.g., red, green, and blue diodes for red, green, and blue pixels, respectively) to provide display 14 with the ability to display color images.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, circuitry 30 may also supply clock signals and other control signals to gate driver circuitry on an opposing edge of display 14.

Gate driver circuitry 34 (sometimes referred to as horizontal control line control circuitry) may be implemented as part of an integrated circuit and/or may be implemented using thin-film transistor circuitry. Horizontal control lines G in display 14 may carry gate line signals (scan line signals), emission enable control signals, and other horizontal control signals for controlling the pixels of each row. There may be any suitable number of horizontal control signals per row of pixels 22 (e.g., one or more, two or more, three or more, four or more, etc.).

Figure 3:
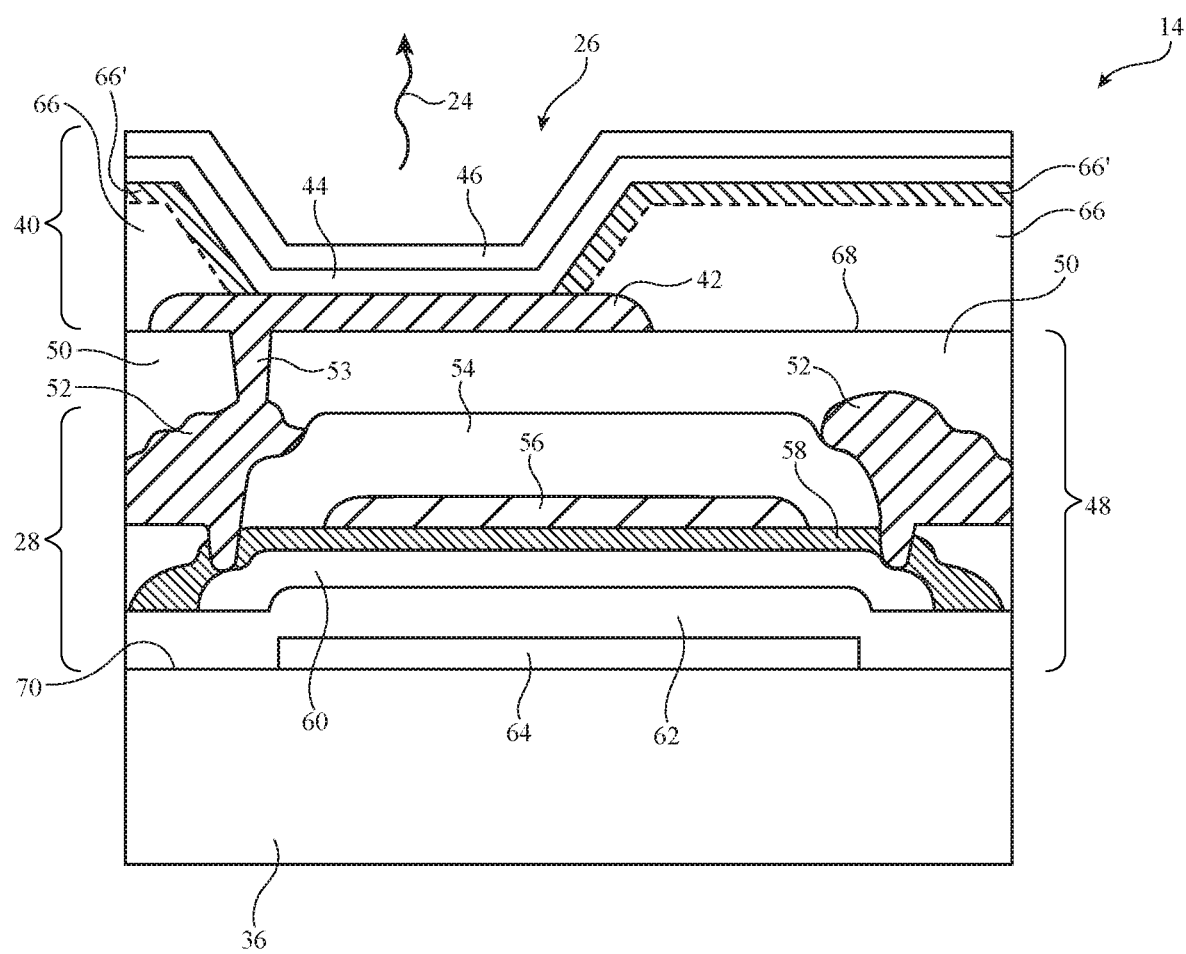
FIG. 3 is a cross-sectional side view of a portion of an illustrative organic light-emitting diode display in accordance with an embodiment.

A cross-sectional side view of a portion of an illustrative organic light-emitting diode display that includes a light-emitting diode (diode 26) for a pixel and thin-film transistor circuitry for an associated pixel circuit (pixel circuit 48) is shown in FIG. 3. As shown in FIG. 3, display 14 may include a substrate layer such as substrate layer 36. Substrate 36 may be a planar layer or a non-planar layer and may be formed from plastic, glass, ceramic, sapphire, metal, or other suitable materials. The surface of substrate 36 may, if desired, be covered with one or more buffer layers (e.g., inorganic buffer layers such as layers of silicon oxide, silicon nitride, etc.).

Thin-film transistor circuitry for pixel circuit 48 may be formed on substrate 36. The thin film transistor circuitry may include transistors, capacitors, and other thin-film structures. As shown in FIG. 3, a transistor such as thin-film transistor 28 may be formed from thin-film semiconductor layer 60. Semiconductor layer 60 may be a polysilicon layer, a semiconducting-oxide layer such as a layer of indium gallium zinc oxide, or other semiconductor layer. Gate layer 56 may be a conductive layer such as a metal layer that is separated from semiconductor layer 60 by an intervening layer of dielectric such as dielectric 58 (e.g., an inorganic gate insulator layer such as a layer of silicon oxide). Dielectric 62 may also be used to separate semiconductor layer 60 from underlying structures such as shield layer 64 (e.g., a shield layer that helps shield the transistor formed from semiconductor layer 60 from charge in buffer layers on substrate 36).

Semiconductor layer 60 of transistor 28 may be contacted by source and drain terminals formed from source-drain metal layer 52. Dielectric layer 54 (e.g., an inorganic dielectric layer) may separate gate metal layer 56 from source-drain metal layer 52. Pixel circuit 48 (e.g., source-drain metal layer 52) may be shorted to anode 42 of light-emitting diode 26 using a metal via such as via 53 that passes through dielectric planarization layer 50. Planarization layer 50 may be formed from an organic dielectric material such as a polymer.

Light-emitting diode 26 is formed from light-emitting diode layers 40 on the thin-film transistor layers of pixel circuit 48. Each light-emitting diode has a lower electrode such as anode 42 and an upper electrode such as cathode 46. Display 14 may be a top emission display. In a top emission display, the lower electrode may be formed from a reflective conductive material such as patterned metal to help reflect light that is produced by the light-emitting diode in the upwards direction out of the display. The lower electrode may, as an example, be a reflective metal electrode formed from a silver alloy having a reflectivity of at least 98%, at least 99%, etc. The upper electrode (sometimes referred to as the counter electrode) may be formed from a partially reflective metal layer that forms an optical cavity for diode 26. The upper electrode may, as an example, be formed from a magnesium silver alloy and may have a reflectivity of 50-70%, at least 40%, at least 55%, less than 80%, less than 75%, or other suitable reflectivity.

The partial reflectivity (partial transparency) of the upper electrode allows the upper electrode to transmit light outwards that has been produced by emissive material in the diode. Layers such as a hole injection layer, hole transport layer, emissive material layer, electron transport layer, and electron injection layer may be formed above the lower electrode and below the upper electrode.

In the illustrative configuration of FIG. 3, display 14 has a top emission configuration and lower electrode 42 is an anode and upper electrode 46 is a cathode. Layers 40 include a patterned metal layer that forms anodes such as anode 42. Anode 42 is formed within an opening in pixel definition layer 66. Pixel definition layer 66 may be formed from a patterned photoimageable polymer. The photoimageable polymer may be formed from an opaque material and/or a layer of opaque material such as black masking layer 66' may cover other material in layer 66 (e.g., opaque layer 66' may cover a layer of semitransparent polyimide or other polymer).

In each light-emitting diode, organic emissive material 44 is interposed between a respective anode 42 and cathode 46. Anodes 42 may be patterned from a layer of metal on a planarization layer in the thin-film transistor layers of pixel circuit 48 such as planarization layer 50. Cathode 46 may be formed from a common conductive layer that is deposited on top of pixel definition layer 66. Cathode 46 is partially reflective and partially transparent so that light 24 may exit light emitting diode 26 as current is flowing through emissive material 44 between anode 42 and cathode 46. In each diode, an optical cavity is formed from a partially reflective cathode 46 and reflective anode 42.

To protect light-emitting diodes 26 and other circuitry in pixels 22, pixels 22 may be covered with encapsulation structures (e.g., a glass layer or thin-film capping layer formed on the upper surface of display 14). The capping layer can contribute to the optical cavity of each light-emitting diode and therefore has the potential for influencing the color of light produced by each pixel. If care is not taken, process variations that arise when forming encapsulation for display 14 can cause variations in the properties of the optical cavities of light-emitting diodes 26 and therefore the color performance of display 14.

To reduce the impact of process variations on display color performance, a wrinkled layer (sometimes referred to as a spinodal wrinkling structure) can be used as a capping layer for diodes 26. Across the surface of the optical cavity of each diode 26, the wrinkled layer effectively creates multiple smaller cavities with a variety of different cavity lengths. Taken together, these random cavity length variations reduce the impact of process variations in the passivation layers above the diodes on the color performance of the diodes. As a result, display 14 exhibits less sensitivity to encapsulation process variations.

Any suitable arrangement may be used in forming a wrinkled layer on display 14. With one illustrative configuration, first and second layers of different respective organic materials are formed above diodes 26. The first layer may be deposited on the surface of display 14 before the second layer. The first and second layers may be formed from materials of the type that are sometimes used in forming organic light-emitting diode emissive layers (e.g., hole transport layer materials, etc.) or other materials compatible with the formation of diodes 26. The first layer may have a first glass transition temperature and the second layer may have a second glass transition temperature. The first glass transition temperature may be lower than the second glass transition temperature. By annealing the first and second layers at an annealing temperature between the first and second glass transition temperatures, the first and second layers may be caused to wrinkle.

Figure 4:
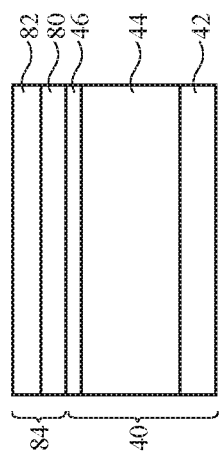
FIG. 4 is a cross-sectional side view of a portion of a partially fabricated organic light-emitting diode display in accordance with an embodiment.

FIG. 4 is a cross-sectional side view of a portion of display 14 after first layer 80 and second layer 82 of wrinkled layer 84 have been deposited prior to annealing. With one illustrative arrangement, first layer 80 may be an organic material such as TPD (N,N'-Bis(3-methylphenyl)-N,N'-diphenylbenzidine, which is sometimes used as a hole transport layer in organic light-emitting diodes, and may have a glass transition temperature of about 60° C. Second layer 82 may, as an example, be NPB (N,N'-Di(1-naphthyl)-N,N'-diphenyl-(1,1'-biphenyl)-4,4'-diamine) and may have a glass transition temperature of about 100° C. The thicknesses of the first and second layers may be about 10-200 nm, 2-1000 nm, at least 20 nm, at least 30 nm, at least 50 nm, at least 100 nm, less than 150 nm, less than 120 nm, less than 100 nm, less than 80 nm, less than 40 nm, or other suitable thicknesses.

After annealing at a temperature T between 60° C. and 100° C. (e.g., for 5-10 minutes), stresses are produced that cause first layer 80 and second layer 82 to wrinkle and form wrinkled layer 84 of FIG. 5. The period (peak-to-peak wrinkle size) of the wrinkles in layer 84 may be such that there are multiple wrinkles within each pixel area. For example, if each diode 26 has a lateral size of about 20-50 microns, the size of each wrinkle in layer 84 may be about 2-10 microns. The wrinkles may form a sinuous randomly-oriented pattern when viewed from above. Diode 26 may have a maximum lateral dimension of 20-50 microns, at least 15 microns, less than 75 microns, or other suitable size and the period of the wrinkles in wrinkled layer 84 may be such that the maximum lateral dimension divided by the period is 3-30, at least 2, at least 5, at least 10, less than 100, less than 50, less than 25, less than 20, less than 10, or other suitable amount. In general, it may be desirable for the period of the wrinkles in layer 84 to be greater than about one tenth of a wavelength of light (e.g., 0.05 microns, which is one tenth of 0.5 microns for green light) to ten times the wavelength of light (e.g., 5 microns for green light). The wrinkles of layer 84 may, for example, have a period of at least 0.1 micron, at least 0.5 microns, at least 1 micron, at least 2 microns, at least 4 microns, at least 5 microns, at least 10 microns, less than 20 microns, less than 15 microns, less than 8 microns, less than 3 microns, or other suitable size. The thickness of the wrinkles (crest-to-trough height difference) may be 0.05 microns to 10 microns, at least 0.1 microns, at least 0.5 microns, at least 1 micron, less than 20 microns, or other suitable size. If desired, wrinkled layer 84 may be used in larger light-emitting diodes used for lighting. For large light-emitting diodes such as diodes used in lighting, the dimensions of the wrinkles in wrinkled layer 84 can be enlarged accordingly.

The thickness variations imposed by the wrinkles in wrinkled layer 84 create optical cavity length variations for the optical cavities of diodes 26. These optical cavity length variations are random and therefore help homogenize color variations that might otherwise arise from optical cavity variations in diodes 26. As a result, the optical impact of process variations associated with forming encapsulation structures for display 14 (e.g., process variations leading to encapsulation thickness variations, etc.) may be reduced.

Figure 5:
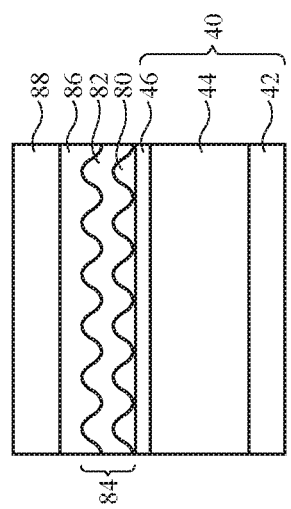
FIG. 5 is a cross-sectional side view of the portion of the organic light-emitting diode display of FIG. 4 after additional processing in accordance with an embodiment.

In the example of FIG. 5, wrinkled layer is covered with encapsulation structures such as glass layer 88. A layer such as layer 86 (e.g., an air gap or a layer of polymer) may be interposed between glass encapsulation layer 88 and wrinkled layer 84.

Figure 6:
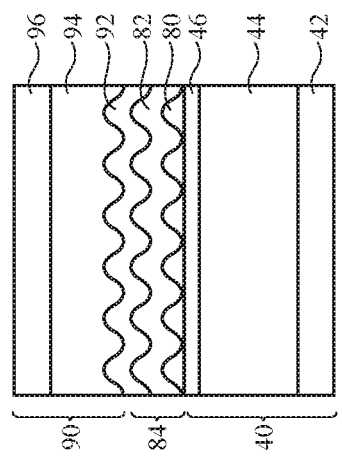
FIG. 6 is a cross-sectional side view of the portion of the organic light-emitting diode display of FIG. 4 after additional processing with alternative process steps in accordance with an embodiment.

In the example of FIG. 6, encapsulation structures 90 have been formed from thin-film encapsulation layers such as passivation layer 92, planarization layer 94, and passivation layer 96. First passivation layer 92 may be formed on the surface of wrinkled layer 84. First passivation layer 92 may be formed from an inorganic dielectric layer such a layer of silicon nitride or silicon oxynitride (as examples). The thickness of layer 92 may be about 0.5-2 microns, at least 0.3 microns, at least 0.8 microns, less than 3 microns, less than 1.5 microns, or other suitable thickness. Planarization layer 94 may be formed on passivation layer 92. Planarization layer 94 may be formed from an organic material (e.g., a photo-cured or thermally cured liquid polymer). The thickness of planarization layer 94 may be 5-20 microns, at least 1.5 microns, at least 3 microns, at least 4 microns, less than 45 microns, less than 25 microns, less than 10 microns, or other suitable thickness. Second passivation layer 96 may be formed on layer 94 from an inorganic dielectric layer such as a layer of silicon nitride or silicon oxynitride (as examples). The thickness of layer 96 may be about 0.5-2 microns, at least 0.3 microns, at least 0.8 microns, less than 3 microns, less than 1.5 microns, or other suitable thickness.

The foregoing is merely illustrative and various modifications can be made to the described embodiments. The foregoing embodiments may be implemented individually or in any combination.

What is claimed is:

1. A display, comprising:
   a substrate;

organic light-emitting diodes on the substrate, wherein each organic light-emitting diode has an optical cavity formed from first and second electrodes and has emissive material interposed between the first and second electrodes;

a wrinkled layer that includes a first layer of a first organic material and a second layer of a second organic material, wherein the wrinkled layer has a randomly-oriented pattern; and encapsulation structures, wherein in each organic light-emitting diode the first electrode is interposed between the emissive material and the substrate, the second electrode is partially reflective and is interposed between the wrinkled layer and the emissive material, and the wrinkled layer is interposed between the second electrode and the encapsulation structures.

2. The display defined in claim 1 wherein the first organic material and the second organic material have different glass transition temperatures.

3. The display defined in claim 1 wherein in each organic light-emitting diode the first layer is interposed between the second layer and the second electrode of that organic light-emitting diode, wherein the first organic material has a first glass transition temperature, and wherein the second organic material has a second glass transition temperature that is larger than the first glass transition temperature.

4. The display defined in claim 1 wherein the encapsulation structures comprise a glass layer.

5. The display defined in claim 4 wherein the glass layer is separated from the wrinkled layer by an air gap.

6. The display defined in claim 4 further comprising a polymer layer that separates the glass layer from the wrinkled layer.

7. The display defined in claim 1 wherein the encapsulation structures include at least one thin-film encapsulation layer.

8. The display defined in claim 1 wherein the encapsulation structures comprise:
a first thin-film inorganic layer on the wrinkled layer;
a second thin-film inorganic layer; and
a polymer layer interposed between the first and second thin-film inorganic layers.

9. The display defined in claim 1 wherein the organic light-emitting diodes each have a maximum lateral dimension, wherein the wrinkled layer has wrinkles characterized by a period, and wherein the maximum lateral dimension divided by the period is 3-30.

10. The display defined in claim 1 wherein the wrinkled layer has wrinkles characterized by a period of 0.05 microns to 5 microns.

11. The display defined in claim 10 wherein the first organic material has a first glass transition temperature and the second organic material has a second glass transition temperature that is greater than the first glass transition temperature.

12. The display defined in claim 10 wherein the wrinkled layer is an organic annealed layer formed from the first organic material, which has a glass transition temperature below an annealing temperature, and formed from the second organic material, which has a glass transition temperature above the annealing temperature.

13. The display defined in claim 12 wherein the first organic material is interposed between the second organic material and the second electrode of each light-emitting diode.

14. A light-emitting diode device, comprising:
an optical cavity formed from a reflective electrode, a partially reflective electrode, and emissive material interposed between the reflective electrode and the partially reflective electrode; and
a wrinkled layer on the partially reflective electrode that includes a first organic layer with a first glass transition temperature and a second organic layer with a second glass transition temperature that is greater than the first glass transition temperature, wherein the partially reflective layer is interposed between the first organic layer and the emissive material.

15. The light-emitting diode device defined in claim 14 further comprising encapsulation structures on the wrinkled layer that include first and second inorganic passivation layers and an organic layer interposed between the first and second inorganic passivation layers.

16. A display, comprising:
a substrate;
organic light-emitting diodes on the substrate, wherein each organic light-emitting diode has an optical cavity formed from a reflective electrode and a partially reflective electrode and has emissive material interposed between the reflective electrode and the partially reflective electrode;
a wrinkled layer having a first organic layer with a first glass transition temperature covered with a second organic layer having a glass transition temperature that is higher than the first glass transition temperature; and
encapsulation structures that encapsulate the wrinkled layer and the organic light-emitting diodes.

17. The display defined in claim 1 wherein the wrinkled layer forms cavities having a plurality of cavity lengths.

* * * * *